(12) United States Patent
Markulic et al.

(10) Patent No.: US 11,356,061 B2
(45) Date of Patent: Jun. 7, 2022

(54) METHOD OF CALIBRATING AND A CALIBRATION CIRCUIT FOR A TWO-POINT MODULATION PHASE LOCKED LOOP

(71) Applicant: IMEC VZW, Leuven (BE)

(72) Inventors: Nereo Markulic, Etterbeek (BE); Jan Craninckx, Boutersem (BE); Miguel Glassee, Schulen (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/061,147

(22) Filed: Oct. 1, 2020

(65) Prior Publication Data
US 2021/0104976 A1   Apr. 8, 2021

(30) Foreign Application Priority Data
Oct. 2, 2019   (EP) .................................... 19200986

(51) Int. Cl.
*H03C 3/09* (2006.01)
*H03L 7/093* (2006.01)
*H03L 7/099* (2006.01)

(52) U.S. Cl.
CPC ......... *H03C 3/0991* (2013.01); *H03C 3/0925* (2013.01); *H03C 3/0941* (2013.01); *H03L 7/093* (2013.01); *H03L 7/099* (2013.01)

(58) Field of Classification Search
CPC .. H03C 3/0991; H03C 3/0925; H03C 3/0941; H03L 7/093; H03L 7/099
See application file for complete search history.

(56) References Cited

U.S. PATENT DOCUMENTS

| | | | | |
|---|---|---|---|---|
| 7,612,617 B2 * | 11/2009 | Pullela | ................. | H03C 3/0925 331/16 |
| 7,940,142 B2 * | 5/2011 | Jensen | ................. | H03C 3/0933 332/128 |
| 8,290,108 B2 * | 10/2012 | Marie | ................. | H03C 3/0925 375/376 |

(Continued)

OTHER PUBLICATIONS

Extended European Search Report and Written Opinion, EP Application No. 19200986.8, dated Apr. 9, 2020, 16 pages.

(Continued)

*Primary Examiner* — Freshteh N Aghdam
(74) *Attorney, Agent, or Firm* — McDonnell Boehnen Hulbert & Berghoff LLP

(57) ABSTRACT

The method of calibrating a two-point modulation phase locked loop (PLL) comprises observing, between the loop filter and the second injection point, the loop control signal over at least one period of the first periodic control signal; generating, from the observed loop control signal, a distortion profile; and applying the distortion profile to the second periodic control signal before injecting the second periodic control signal in the PLL. Since, in the case of non-linearity in the controlled oscillator, the PLL output deviates from the ideally expected one, cancellation through the first injection point becomes imperfect disturbing the loop. This error pattern can be observed on the loop filter which allows to generate a distortion profile to distort the second periodic control signal for the next period of the modulation. This will mitigate the effects of the non-linearity of the oscillator.

19 Claims, 4 Drawing Sheets

(56) References Cited

U.S. PATENT DOCUMENTS

| | | | |
|---|---|---|---|
| 9,596,038 B2* | 3/2017 | Da Dalt | H04B 15/04 |
| 9,832,011 B1* | 11/2017 | Wicpalek | H04L 7/033 |
| 9,935,640 B1* | 4/2018 | Chan | H03C 3/0925 |
| 2003/0043950 A1* | 3/2003 | Hansen | H03C 3/0941 |
| | | | 375/376 |
| 2005/0073368 A1* | 4/2005 | Owen | H03C 3/0933 |
| | | | 331/16 |
| 2005/0185749 A1* | 8/2005 | Convent | H03C 3/095 |
| | | | 375/376 |
| 2009/0219100 A1 | 9/2009 | Pullela et al. | |
| 2011/0148676 A1* | 6/2011 | Waheed | H03L 7/091 |
| | | | 341/131 |
| 2012/0201338 A1* | 8/2012 | Leung | H03C 3/0941 |
| | | | 375/376 |
| 2017/0141857 A1* | 5/2017 | Casagrande | H03F 3/245 |

OTHER PUBLICATIONS

Cherniak, Dmytro, Luigi Grimaldi, Luca Bertulessi, Roberto Nonis, Carlo Samori, and Salvatore Levantino. "A 23-GHz low-phase-noise digital bang-bang PLL for fast triangular and sawtooth chirp modulation." IEEE Journal of Solid-State Circuits 53, No. 12 (2018): 3565-3575.

Staszewski, Robert Bogdan, John Wallberg, Chih-Ming Hung, Gennady Feygin, Mitch Entezari, and Dirk Leipold. "LMS-based calibration of an RF digitally controlled oscillator for mobile phones." IEEE Transactions on Circuits and Systems II: Express Briefs 53, No. 3 (2006): 225-229.

Mueller, Jan Henning, Andreas Neyer, Ralf Wunderlich, and Stefan Heinen. "Continuous gain calibration of an FM-radio transmitter based on an all-digital PLL." In 6th Conference on Ph. D. Research in Microelectronics & Electronics, pp. 1-4. IEEE, 2010.

Wu, Wanghua, Robert Bogdan Staszewski, and John R. Long. "A 56.4-to-63.4 GHz multi-rate all-digital fractional-NPLL for FMCW radar applications in 65 nm CMOS." IEEE Journal of solid-state circuits 49, No. 5 (2014): 1081-1096.

Lee, Sungho, Jaejun Lee, Hangue Park, Kang-Yoon Lee, and Sangwook Nam. "Self-calibrated two-point delta-sigma modulation technique for RF transmitters." IEEE Transactions on Microwave Theory and Techniques 58, No. 7 (2010): 1748-1757.

Staszewski, Robert B., Dirk Leipold, and Poras T. Balsara. "Just-in-time gain estimation of an RF digitally-controlled oscillator for digital direct frequency modulation." IEEE Transactions on Circuits and Systems II: Analog and Digital Signal Processing 50, No. 11 (2003): 887-892.

\* cited by examiner

METHOD OF CALIBRATING AND A CALIBRATION CIRCUIT FOR A TWO-POINT MODULATION PHASE LOCKED LOOP

CROSS-REFERENCE TO RELATED APPLICATIONS

The present application is a non-provisional patent application claiming priority to European Patent Application No. EP 19200986.8, filed on Oct. 2, 2019, the contents of which are hereby incorporated by reference.

FIELD OF THE DISCLOSURE

The present disclosure is directed to a method of calibrating a two-point modulation phase locked loop (PLL). The present disclosure is further directed to a calibration circuit for a two-point modulation PLL and to a two-point modulation PLL comprising the calibration circuit.

BACKGROUND

A phase-locked loop (PLL) is typically used for carrier frequency synthesis, but it can also be used for direct carrier modulation. The digital input data is then directly converted into frequency modulated (FM) PLL output. The PLL hence serves as a modulator. The digital to modulated frequency conversion is ideally linear to avoid distortion and consequential information loss.

A typical example of a PLL-based modulator can be found in Frequency Modulated Continuous Wave (FMCW) radar applications. There, the modulator is used to produce a periodic frequency modulation pattern at its output, often referred to as chirps. In contrast to PLL modulators that are used to handle random data, in the PLL according to the present disclosure the signal to be modulated is known and periodic.

A two-point modulation PLL is schematically shown in FIG. 1. The known PLL 100 comprises a reference path 105 for supplying a reference signal to the PLL 100. The reference signal is a constant-frequency signal coming typically from a crystal oscillator or another local oscillator having a frequency in the Megahertz to Gigahertz range. A phase/frequency detector 110 is used to generate a phase/frequency error signal representative of a phase or frequency error of a feedback signal with respect to the reference signal, where the feedback signal is derived from at least the periodic frequency-modulated signal output from the PLL. The phase/frequency detector 110 is coupled to a loop filter 115 which is configured to filter the phase/frequency error signal to generate a loop filter output (e.g., loop control signal 185). The PLL 100 further includes a controlled oscillator 120 to generate the periodic frequency-modulated signal that is sent to output 145 and to a feedback path 125 from the controlled oscillator 120 to the phase/frequency detector 110. In a two-point modulation PLL 100, there are two injection points 130, 135 for the PLL 100. A first injection point 130 is present within the feedback path 125 and is used to inject a first periodic input signal in the PLL 100. A second injection point 135 is present between the loop filter 115 and the controlled oscillator 120 and is used to inject a second periodic control signal in the PLL 100 at the summation node 175. The second periodic control signal is derived from the first periodic input signal input at the first injection point 130. In the illustrated embodiment, a programmable divider 140 is used for injecting the first periodic input signal input in the feedback path 125.

It will readily be appreciated that, the PLL 100 may operate with different feedback mechanisms that may exclude a programmable divider 140 in the feedback path 125. In general, the first injection point 130 can then applied in another phase modulating unit, e.g. a digitally programmable delay line, a digital-to-time converter, a phase-interpolator or the like, placed in the feedback path 125 and/or in the reference path 105 of the PLL.

Moreover, the summation node 175 may, in certain implementations, also be present within the controlled oscillator 120 which then has two inputs, namely one from the loop filter 115 and one from the second injection point 135.

The PLL building blocks described above can be implemented in a variety of ways, both in digital and in the analogue domain. Moreover, some of the blocks can also be omitted (for example the divider 140 in presence of another phase modulating element in the feedback path 125 or reference path 105), but the principle of two-point data injection for output modulation remains the same.

In example embodiments of the present disclosure, in two-point modulation PLL, both points utilized simultaneously to overcome PLL bandwidth limitations.

The method of operating the known PLL 100 is illustrated in FIG. 2. The known operating method 200 comprises: injecting 202, at the first injection point 130, a first periodic control signal in the PLL 100; supplying 204, along the reference path 105, a reference signal to a first input of the phase/frequency detector 110; supplying 206, along the feedback path 125, a feedback signal to a second input of the phase/frequency detector 110, wherein the feedback signal is derived from at least the periodic frequency-modulated signal output from the PLL 100, wherein at least one of the reference signal and the feedback signal is at least partly derived from the first periodic control signal; generating 208, by the phase/frequency detector 110, an error signal representative of a phase or frequency error of the feedback signal with respect to the reference signal; filtering 212, by the loop filter 115, the phase/frequency error signal to generate a loop control signal (e.g., loop filter output 185); injecting 214, at the second injection point 135, a second periodic control signal in the PLL 100, wherein the second periodic control signal is derived from the first periodic control input signal; regenerating 216, by the controlled oscillator 120, the periodic frequency-modulated signal based on the control signal and the second periodic control signal; and regenerating 218, within at least one of the feedback path 125 and the reference path 105, at least one of the reference signal and the feedback signal from at least one of the reference signal, the periodic frequency-modulated signal and the first periodic control signal.

It will be appreciated that the above description of operating method 200 was described with respect to how a signal part gets processed in the PLL 100. However, in reality, the signal parts get processed simultaneously within the PLL 100. As such, while a part of the periodic input signal, i.e. the sum of the loop filter output (e.g., loop control signal 185) and the second periodic control signal, is processed in the controlled oscillator 120, the feedback signal is being regenerated based on the current output of the controlled oscillator 120, while the phase/frequency detector 110 is also operating, etc.

During matched and linear two-point modulation using the PLL 100, the output of the PLL 100 follows a desired frequency/phase modulation pattern, while the loop filter 115 output remains constant, i.e. it settles around a static operating point and experiences only small fluctuations under influence of environmental noise. In other words, during modulation, data injected through the second injection point 135 is transferred to the output (inducing the desired modulation pattern), while the injection of the data in the first injection point 130 ensures that the inner loop (phase/frequency detector 110 and loop filter 115) experiences no influence under the modulation signal. The data injected in the first injection point 130 hence cancels the influence of the second injection point 135 on the loop itself, while the modulator output 145 follows the desired periodic pattern, unhindered by any PLL related filtering.

For conversion of the digital data into the modulated output, the injection points 130, 135 should be accurate and well characterized. The path from the second injection point 135 to the output 145 is typically non-linear. This results in output signal quality degradation. For example, with a voltage controlled oscillator (VCO) 120, the application of linearly changing voltage at its input should ideally result with linear oscillation frequency shift (see solid line of FIG. 3). However, in realistic environments, the oscillation frequency is a non-linear function of input voltage as shown in FIG. 3 with a dashed line. This profile can be a direct consequence of inherit non-linear capacitance-to-frequency conversion in the LC tank, typically used in a VCO, but also any other non-linearity. Note that operation of a digitally-controlled oscillator is completely equivalent, except for the fact that the input voltage is then replaced by digital input code.

Methods are utilized to mitigate the effects of non-linearity on the output signal. Examples are Markulic, Nereo, et al. "A DTC-based sub sampling PLL capable of self-calibrated fractional synthesis and two-point modulation." IEEE Journal of Solid-State Circuits 51.12 (2016): 3078-3092; Marzin, Giovanni, et al. "A 20 Mb/s phase modulator based on a 3.6 GHz digital PLL with −36 dB EVM at 5 mW power." IEEE Journal of Solid-State Circuits 47.12 (2012): 2974-2988; and Cherniak, Dmytro, et al. "Adaptive Digital Pre-Emphasis for PLL-Based FMCW Modulators." Circuits and Systems (ISCAS), 2018 IEEE International Symposium on. IEEE, 2018. All these employ calibration methods that distort the first and/or second periodic control signal input to the PLL based on the phase detector output. These disclosures have in common that they are developed for random data modulation systems and not for periodic control signals. Consequently, these systems can not have any filtering in the error detection as it would negatively affect their performance.

SUMMARY

Embodiments of the present disclosure provide a method of calibrating a two-point modulation PLL that mitigates the effects of non-linearity on the output signal for the case of periodic modulation signals.

This is achieved in that the method further comprises the steps of: observing, between the loop filter and the second injection point, the loop control signal over at least one period of the first periodic control signal; generating, from the observed loop control signal, a distortion profile; and applying the distortion profile to the second periodic control signal before injecting the second periodic control signal in the PLL.

The present disclosure is based on the fact that the internal components of the two-point modulation PLL, under ideal circumstances, should behave as expected. In other words, under ideal circumstances, the PLL output follows the desired frequency modulation pattern (i.e. e.g. the desired chirp in an FMCW radar application), while the two-point injection ensures that the PLL loop filter output remains constant (except for fluctuations due to environmental noise) around some fixed value (either a digital or analogue value) with no alternate fluctuations under the influence of the modulation signal. However, in presence of non-linear analogue/digital-to-frequency conversion from the second injection point to the output, the PLL output is no longer an ideal chirp, but includes some undesired pattern. The loop filter output deviates from the original value in this situation thereby partially compensating for the existing frequency error at the PLL output. The observable pattern at the output of the loop filter is thus periodic (with exception of the random noise), under direct influence of the modulation signal (periodic chirp).

From another point of view, since the output chirp pattern deviates from the ideally expected one, cancellation through the first point becomes imperfect and the unexpected portion of the modulation signal (i.e. the difference between the ideal and real) disturbs the loop. This "error pattern" can be observed on the loop filter as it serves in negative feedback for compensation of the phase/frequency error between input and output of the PLL.

Therefore, by observing the loop control signal (i.e. the loop filter output) over at least one period of the first periodic control signal, the error pattern is observed. From this error pattern, a distortion profile is calculated and applied to the second periodic control signal before injecting it into the PLL. Due to the second periodic control signal being distorted before injection, in the next period of the modulation, the effects of the non-linearity of the oscillator will be mitigated as the second periodic control signal has been distorted to counter the non-linearity.

In this way, the present disclosure makes use of the principles of digital data pre-distortion to minimize the influence of the imperfections (i.e. non-linearity). In general, the original input data gets systematically modified before its application, so that as it passes through the imperfect modulation path, it still creates the desired effect.

In an embodiment of the present disclosure, the step of observing the loop control signal comprises observing the control signal over a plurality of periods of the first periodic control signal and the step of generating a distortion profile comprises averaging the observed control signal over the plurality of periods.

This averaging is desirable as noise from the PLL operation and the observation process is thus filtered and suppressed to a certain degree.

In an alternative embodiment of the present disclosure, the step of observing the loop control signal comprises observing the control signal over a single period of the first periodic control signal and the calibration steps are executed once each period of the first periodic control signal.

This leads to a more frequent update of the second periodic control signal. Moreover, the non-linearity is iteratively mitigated in this embodiment due to the various updates.

In an embodiment of the present disclosure, the calibration procedure is an iterative process.

In cases where the first distorted profile applied is not yet sufficiently accurate, the control signal is further observed and further distortion profiles are calculated until sufficient modulation accuracy is achieved.

The object of the present disclosure is also achieved by a calibration circuit for a two-point modulation PLL for generating a periodic frequency-modulated signal, the PLL comprising a reference path, a phase/frequency detector, a loop filter, a controlled oscillator, a feedback path, a first injection point within at least one of the feedback path and the reference path and a second injection point between the loop filter and the controlled oscillator, characterized in that the calibration circuit comprises: an observation module configured to observe an output of the loop filter over at least one period; and a processor configured to generate a distortion profile from the observed loop control signal and to apply the distortion profile to a second periodic control signal before injecting the second periodic control signal in the PLL at the second injection point.

The calibration circuit is able to execute all method steps involved with calibrating the PLL.

The object of the present disclosure is also achieved by a two-point modulation PLL for generating a periodic frequency-modulated signal, the PLL comprising: a reference path configured for supplying a reference signal to the PLL; a phase/frequency detector configured to generate a phase/frequency error signal representative of a phase or frequency error of a feedback signal with respect to the reference signal, wherein the feedback signal is derived from at least the periodic frequency-modulated signal output from the PLL; a loop filter coupled to the phase/frequency detector and configured to filter the phase/frequency error signal to generate a control signal; a controlled oscillator configured to generate the periodic frequency-modulated signal based on the control signal and a second periodic control signal; a feedback path from the controlled oscillator to the phase/frequency detector; a first injection point within at least one of the feedback path and the reference path and configured to inject a first periodic input signal in the PLL, wherein at least one of the reference signal and the feedback signal is at least partly derived from the first periodic control signal; a second injection point between the loop filter and the controlled oscillator and configured to inject the second periodic control signal in the PLL, wherein the second periodic control signal is derived from the first periodic input signal; characterized in that the PLL further comprises a calibration circuit as described above, wherein the observation module is connected to the PLL between the filter and the second injection point.

The PLL comprises the calibration circuit which is able to execute all method steps for calibrating the PLL.

BRIEF DESCRIPTION OF THE FIGURES

The above, as well as additional, features will be better understood through the following illustrative and non-limiting detailed description of example embodiments, with reference to the appended drawings.

Figure 1:
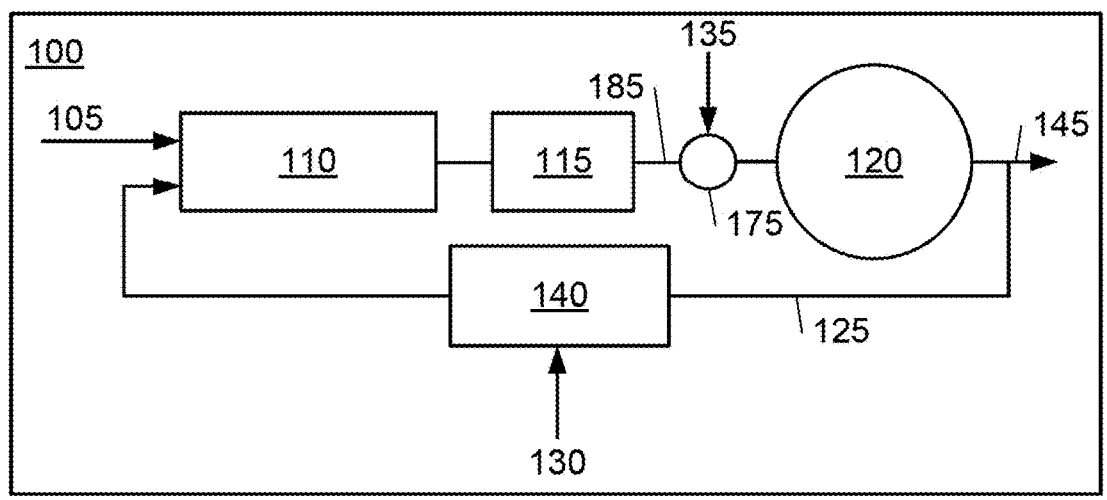
FIG. 1 illustrates a known two-point modulation PLL.
Figure 2:
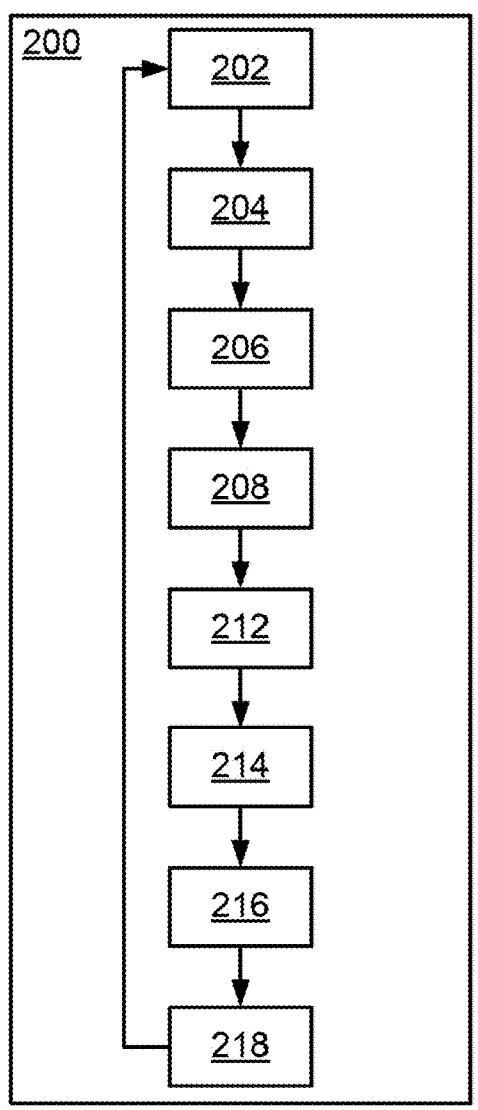
FIG. 2 illustrates a flow-chart illustrating the operation of the PLL of FIG. 1.
Figure 3:
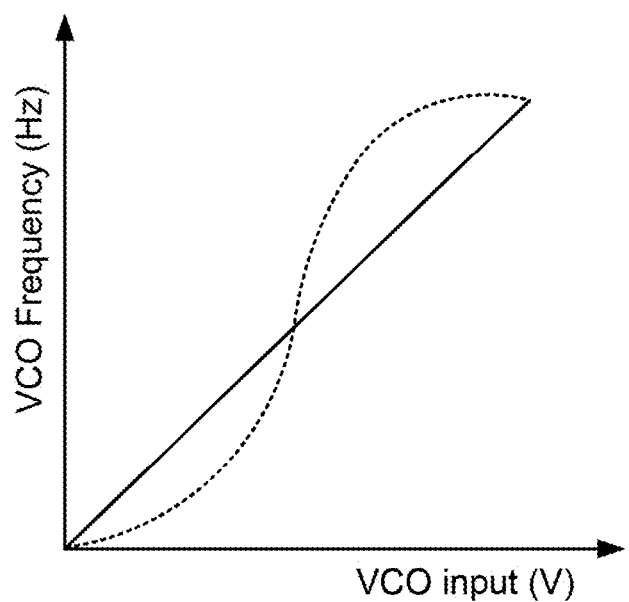
FIG. 3 illustrates an ideal (solid line) and a non-linear (dashed line) VCO voltage-to-frequency conversion using the PLL of FIG. 1.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under certain circumstances and the embodiments of the disclosure can operate in other sequences than described or illustrated herein.

Moreover, the terms top, bottom, over, under and the like in the description and the claims are used for descriptive purposes. The terms so used are interchangeable under certain circumstances and the embodiments of the disclosure described herein can operate in other orientations than described or illustrated herein.

Furthermore, the various embodiments, although referred to as "preferred" are to be construed as example manners in which the disclosure may be implemented rather than as limiting the scope of the disclosure.

Figure 4:
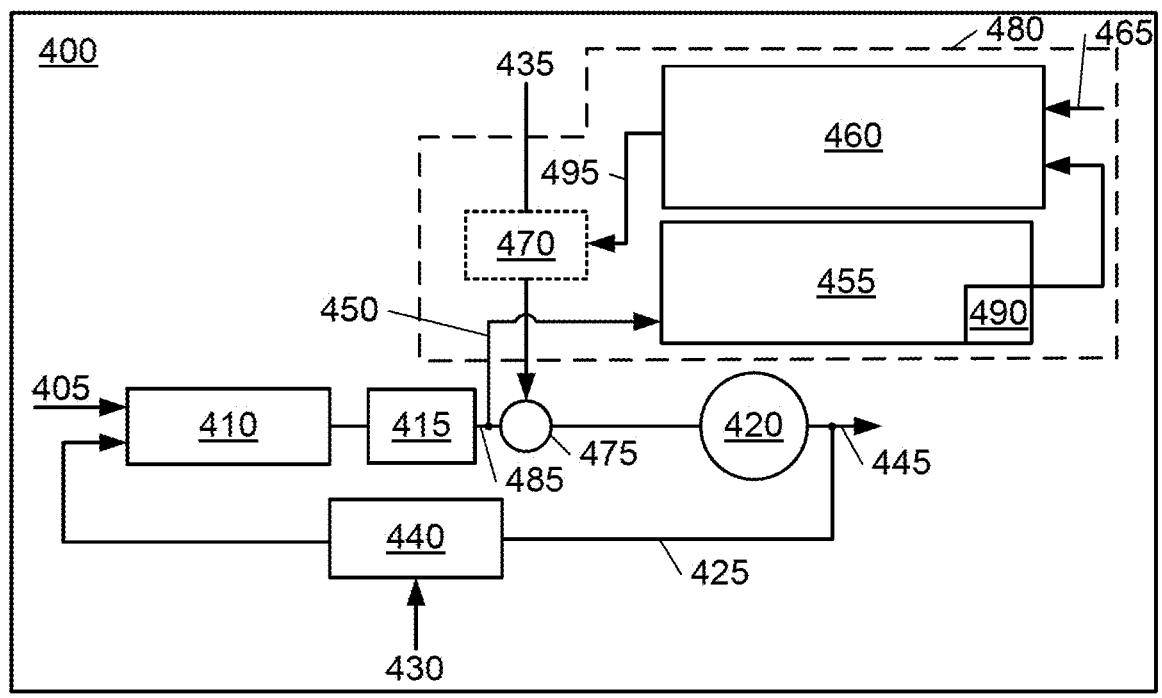
FIG. 4 illustrates a two-point modulation PLL according to the present disclosure.

A two-point modulation PLL 400 according to the present disclosure is shown in FIG. 4. Elements already described with respect to the known PLL 100 of FIG. 1 will not be described in detail and will use the same last two reference numbers but preceded with "4" instead of "1".

The PLL 400 comprises: a reference path 405; a phase/frequency error detector 410; a loop filter 415; a controlled oscillator 420; an output 445; a feedback path 425; two injection points 430, 435; a programmable divider 440 or an alternative component with similar phase/frequency modulating capabilities as discussed above; and a summation node 475. The PLL 400 also comprises an observation path 450 coupled to an observation module 455 and a processor 460. The processor 460 receives input from the observation module 455 and is further provided with information on the first periodic input signal via input 465. The PLL 400 further includes a distortion module 470 that receives input from the processor 460 and is placed between the second data injection point 435 and the summation node 475. The observation module 455, the processor 460 and the distortion module 470 together form a calibration circuit 480. The function and operation of the calibration circuit 480 will be described below.

Figure 5:
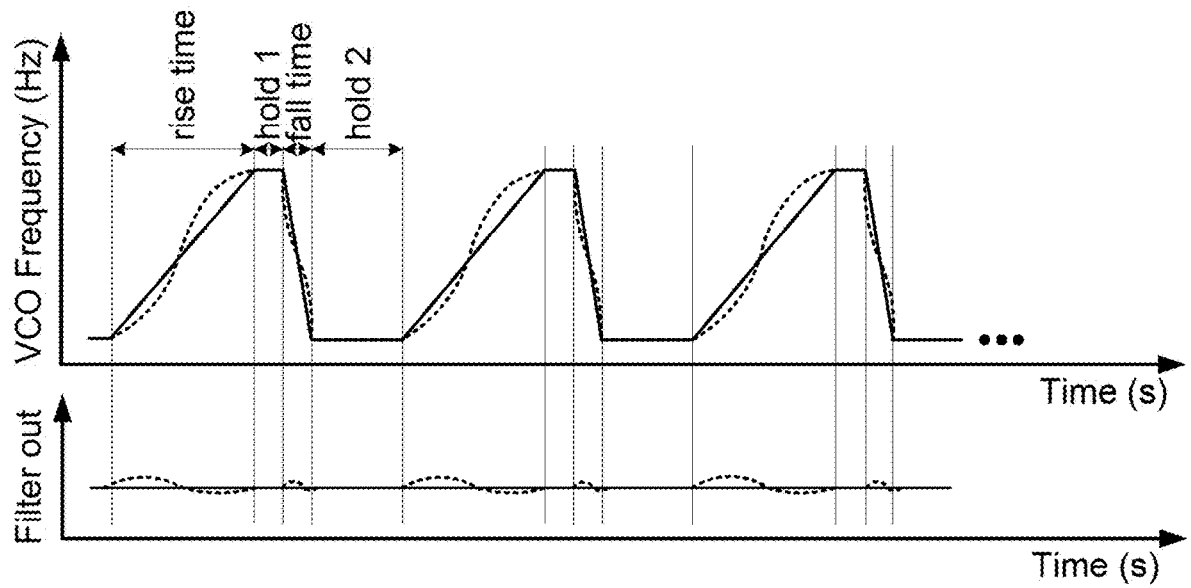
FIG. 5 illustrates the PLL output and loop filter output of the PLL of FIG. 1 under ideal (solid line) and non-linear (dashed line) frequency conversion using the PLL of FIG. 1.

FIG. 5 illustrates the PLL output and loop filter output of the PLL of FIG. 1. Under ideal circumstances (solid line in FIG. 5), the internal components of the two-point modulation PLL should behave as expected. In other words, under ideal circumstances, the PLL output 145 follows the desired frequency modulation pattern (i.e. the desired chirp), while the two-point injection ensures that the PLL loop filter output 185 remains constant (except for fluctuations due to environmental noise) around some fixed value (either a digital or analogue value) with no alternate fluctuations under the influence of the modulation signal as shown with the solid lines in FIG. 5. The second periodic control signal ideally (without nonlinearities in the system) has the same shape as the PLL output 145 (solid line in FIG. 5). It will be readily appreciated that the periodic frequency modulated PLL output signal (referred to as chirp) typically has a triangular shape, with an arbitrarily chosen duration of the rise and fall sections. Optionally, between the rise and fall sections, there are arbitrarily long hold (or idle) sections where the frequency of the PLL is kept constant.

However, in presence of non-linear analogue/digital-to-frequency conversion, the PLL output 145 is no longer an ideal chirp, but includes some undesired pattern (dashed lines in FIG. 5). The loop filter output 185 deviates from the original value in this situation thereby partially compensating for the existing frequency error at the PLL output. The observable pattern at the output of the loop filter is thus periodic (with exception of the random noise), under direct influence of the modulation signal (periodic chirp).

From another point of view, since the output chirp pattern deviates from the ideally expected one, cancellation through the first injection point 130 becomes imperfect and the unexpected portion of the modulation signal (i.e. the difference between the ideal and real) disturbs the loop. This "error pattern" can be observed on the loop filter output 185 as it serves in negative feedback for partial compensation of the phase/frequency error between input and output of the PLL 100.

In the presence of a periodic modulation signal (chirp) and a non-linear second injection point path, a periodic error pattern can be measured at the loop filter output 185. In an analogue environment this can be executed by an Analog-to-Digital converter placed at the loop filter output 185. In a digital environment, a converter is not necessary, and the digital loop filter output is readily used. For this reason, in the PLL 400, the loop filter output 485 also branches via path 450 to the observation module 455. The observation module 455 is configured to observe an output of the loop filter 415 over at least one period, i.e. one period of the chirp pattern, which period is determined by the period of the first/second periodic control signals input at the injection points 430, 435.

The observation module 455 comprises (or at least has access to) a memory 490 where the observed loop filter output may be stored. The observed loop filter output may be stored for only a single period or for multiple periods. The observation module 455 may also include (or at least have access to) a processor that may average the observed loop filter output over a number of periods. This averaging is desirable as noise from the PLL operation and the observation process is thus filtered and suppressed to a certain degree. In this way, the memory 490 stores a measure of the average deviation from the ideal operating point at the loop filter output 485 throughout a single modulation signal (chirp) period (or throughout one of its parts, e.g. its rise or its hold).

The calibration circuit 480 further includes the processor 460 which receives values from the memory 490 and the ideal modulation signal (or one of its derivatives), i.e. the ideal second periodic control signal. Consequently, the processor 460 is able to map the measured error to a particular moment in time of chirp duration allowing the processor 460 to calculate, for each instant within a period, the update values for distorting the second periodic control signal for the next period of the modulation. As described in more detail below, the update values for the distortion module 470 are calculated based on a function which targets minimization of loop filter output swing, i.e. its deviation around the equilibrium value.

Once the values have been calculated, these are sent, via path 495, to the distortion module 470 which iteratively modifies the original second periodic control signal based on the received update values thereby minimizing the error swing measured on the loop filter 415 and consequentially at the PLL output 445.

It will be readily appreciated that the update can happen nearly continuous for each moment within the chirp duration for each period of the modulation. Alternatively, especially in case the observation module 455 uses averaging, the update can happen only once per a few (e.g. 5 or 10) periods of the modulation. Moreover, this calibration will also take into account environmental changes, without disturbing the modulation process itself. The calibration can remain active until the loop filter output experiences ideally no swing or at most a swing below a predefined threshold value.

Figure 6:
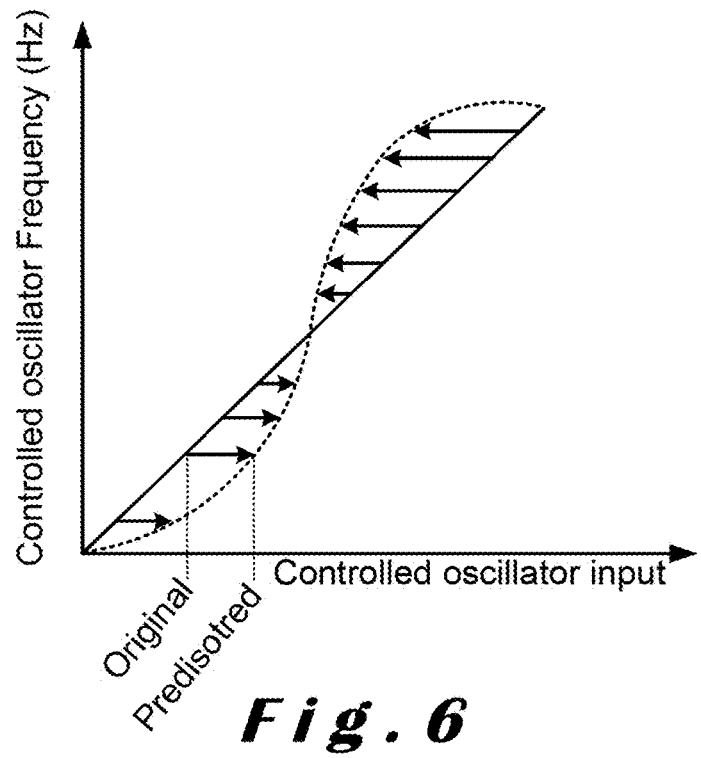
FIG. 6 illustrates the effect of the distortion principle in the PLL second injection point.

The distortion module 470 can be implemented as a look-up table (LUT) with a set of correction coefficients used at corresponding inputs. The LUT coefficients modify the original second periodic control signal over its period to cancel the presence of non-linearity, as shown in FIG. 6. In an alternative embodiment, distortion profiles can be implemented using FIR or IIR digital filtering.

It will be appreciated that the strict separation of blocks used in the example of FIG. 4 (i.e. observation module 455, processor 460 and distortion module 470) is not necessary. In fact, there is a vast variety of ways in which the blocks of the system depicted in FIG. 4 can be implemented. For example, in digital PLLs the phase/frequency error detector 410 is typically implemented as a Time-to-Digital Converter (TDC). The loop filter 415 is then digital and the controlled oscillator 420 operates with digital inputs. In analogue PLLs, the phase/frequency error detector 410 can be implemented as a phase-error detector cascaded with a charge-pump or a subsampling error detector cascaded by a transconductor. The loop filter 415 is then analogue, and the controlled oscillator 420 receives an analogue input signal. Moreover, the PLL-based modulator may operate with different feedback mechanisms that may exclude a classical programmable divider 440 in the feedback path 425. In general, the first injection point 430 can then applied in another phase modulating unit placed in the feedback path 425 and/or in the reference path 405 of the PLL 400 as described above.

Figure 7:
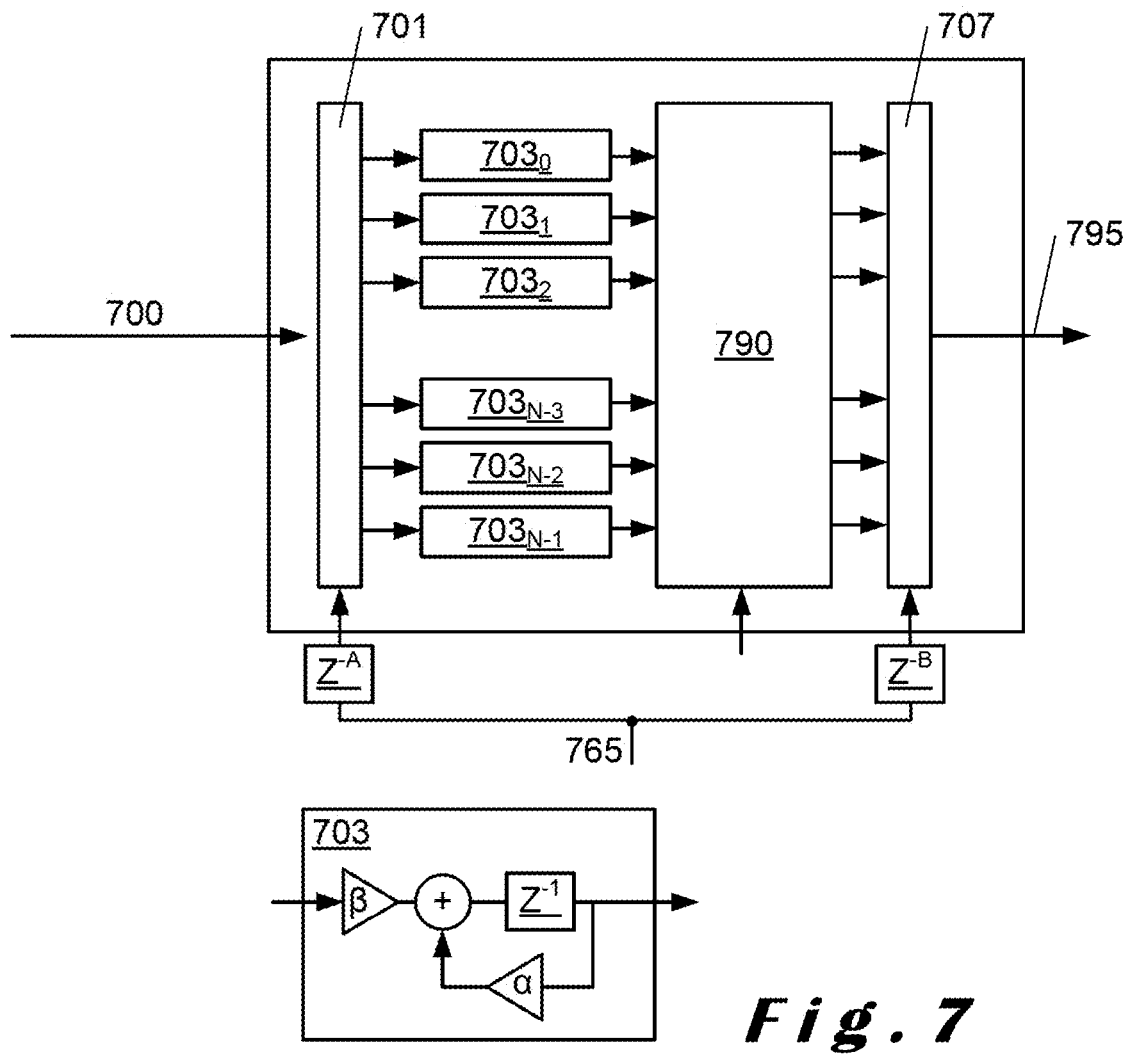
FIG. 7 illustrates an example implementation of the observation module and the processor of the PLL of FIG. 4.

A detailed implementation example of the observation module and the processor of the PLL is shown in FIG. 7. Elements already described with respect to FIG. 4 will not be described in detail and will use the same last two reference numbers but preceded with "7" instead of "4".

The measured loop filter 715 output is systematically directed by a selection unit 701 towards one of the IIR units 7030, 7031, . . . , 703N-1, at some reference rate, where N is the total number of IIR units. Selection is based on the data input 765. In other words, the IIR units map to a particular section of the periodic modulation pattern and measure the corresponding average error (at a particular section of the periodic modulation pattern). There is an arbitrary number N of IIR units. A higher unit count permits better representation of the average error. A lower number of memory units can be used as well, with approximation procedures in portions of the modulation pattern that do not directly map to any of the IIR units. An IIR unit 703 executes exclusively upon its selection, i.e. when selection unit 701 appoints new data to its respective input. The IIR units 703 which are not addressed in the given cycle hold their original state. Note that a and β are chosen for an IIR low-pass filtering characteristic with a resulting gain. As the digital system operates, the IIR units converge towards a scaled version of the average error measured across the respective portion of the periodic input signal. An asynchronous update signal then asserts and updates the memory 790, which may have been initially reset to zero. In particular, the outputs of the IIR units 703 are stripped away from the common DC component and added to the previously memorized data that equally maps to the modulation pattern. In this way, the memory 790 stores the error pattern across the chirp (i.e. the deviation from the average DC level) averaged over multiple periods of the chirp, as described above.

This data can be used for distorting the modulation signal and creating the distorted second periodic modulation signal. For example, a selection unit 707 can select one (or multiple) elements from the memory 790, which elements map to the average measured error at a particular portion of the chirp, and send them to the distortion module via pathway 795. The distortion module 470 uses this information (or one of its derivatives) adding it to the original modulation signal (i.e. the original second periodic control signal) and linearizing the transmitted signal.

Figures 8, 9:
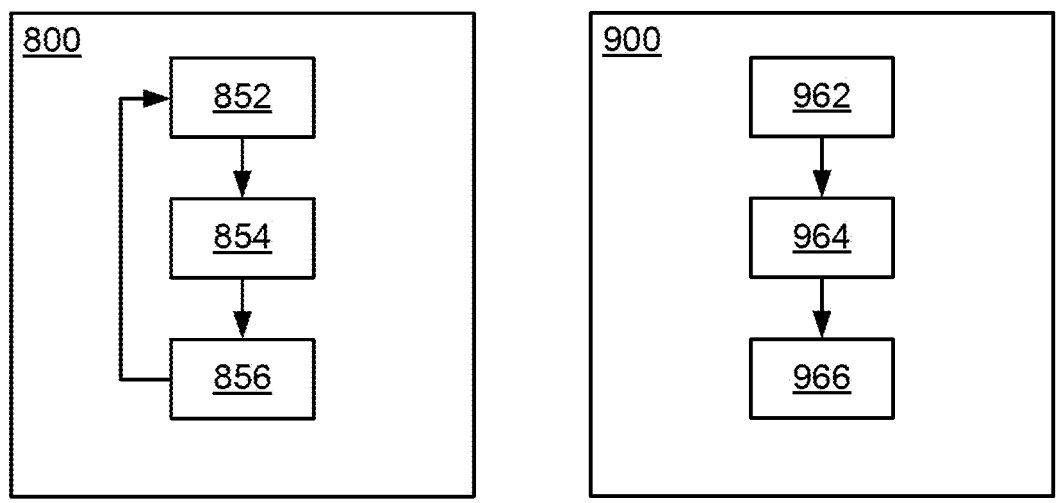
FIG. 8 illustrates a calibration method for calibrating the PLL of FIG. 4.
FIG. 9 illustrates an alternative calibration method for calibrating the PLL of FIG. 4.

FIG. 8 illustrates a calibration method 800 for calibrating the PLL 400. The method 800 comprises the step of observing 852 the loop control signal over at least one period of the first periodic control signal. As described above, this observation may be done both in the digital or the analogue domain depending on the PLL design. In an embodiment, step 852 comprises observing the control signal over a plurality of periods of the first periodic control signal to allow averaging as described above. In another embodiment, step 852 comprises observing the control signal over a single period of the first periodic control signal which leads to a PLL that is calibrated at each iteration.

In step 854, a distortion profile is generated from the observed loop control signal. In principle, the distortion profile is used to create a repetitively injected distorted version of the old second periodic control signal (i.e. the second periodic control signal which was initially there before the distortion is initialized). The distortion profile can be stored in the digital domain as a sequence of digital codes that are periodically injected in the second injection point 435. By a sequence of digital codes it is meant that there is a set of digital numbers stored in the memory 790. This sequence of digital codes can be mapped to the period of the second periodic control signal. The distorted second periodic modulation signal may be applied in the digital domain (assuming a digitally controlled oscillator 420) or in the analogue domain (assuming a voltage-controlled oscillator 420) in which case some form of digital-to-analogue conversion of the distortion profile may be performed.

In step 856, the distortion profile is applied to the second periodic control signal before injecting the second periodic control signal in the PLL. In practice, this may be achieved by adding the sequence of digital codes to the original second periodic control signal over time.

FIG. 9 illustrates a second example of a calibration method. The distortion profile is obtained by adjusting a compensation table, in the distortion module 470 in specific way, with a given update size (where update size refers to the size of the adjustment possible for the distortion profile). The target is to identify the compensation table values which cancel the nonlinearity of the digital-to-frequency conversion, while the PLL 400 is chirping in the background. When the nonlinearity is perfectly cancelled by the compensation table, the memorized low pass filter output remains flat around a constant value as described above. In an embodiment, a large update size is used at the beginning of the calibration to get quickly to a close result of the distortion profile. Afterwards, the update size is decrease for fine-tuning.

Step 962 is an initialization step where all the compensation table values are modified once with a large update size by the digital processor 460, based on the information from the memory 490. Afterwards, in step 964, the loop filter output is measured again across arbitrary number of chirps (with optional averaging) and then stored in the memory 490. The compensation table values are modified again with a smaller update size. This procedure is iteratively repeated with continuously decreasing update size with which the compensation table is modified, until a minimum update size is attained. An update size reduction can for example be halving of the previous update size.

After initialization as described above, it is necessary to establish the background operation procedure 966. To robustly track chirp linearity with environmental changes, one can increase the update size with which compensation table values are modified if the current update size is not sufficient to improve the chirp linearity (i.e., to reduce the swing on the low-pass filter output below the desired threshold, referred to as "calibration metric"). The background operation procedure 966 may be established as follows: The processor 460 modifies all the indices of the compensation table that are relevant for the current chirp. The modification at the chosen positions of the compensation table is done by updating the values in two directions, positive and negative. The impact of this changes is re-measured and stored in the memory, respectively. For both adjustments independently, the memory 490 is consulted to verify whether the adjustment improved the chirp linearity, i.e. the above defined "calibration metric". If so, the adjustment is accepted. If not, it is discarded.

The order in which the indices of the compensation table are traversed, can differ. If the low pass filter output (or one of its derivatives) is available in synchronization with the chirp (stored in the memory 490), one may traverse the compensation table going from positions where the PLL output diverts most from the ideal chirp (largest deviation from the average value in the memorized low pass filter output) to the frequencies where the PLL output is closest to the ideal chirp (smallest deviation from the average value in the memorized low pass filter output). Otherwise, random traversal, or from lowest to highest frequencies can be considered.

In order to avoid abrupt modifications to the correction table, the table is not only adjusted at a certain index, but also at a few of its neighbouring indexes. Moreover, in order to avoid sharp edges in the adjustment, the adjustment is based on a function that has a first order derivative of 0 in the centre and at the edges. An example could be an adjustment profile of be 0.5*(1+cos x). with x changing from $-\pi$ to $\pi$ in linear steps (defined with number of neighbouring coefficients used).

In general, the calibration procedure consists of adjusting the distortion profile in the distortion module 470 in specific way, with a given step size, where step size refers to the size of the adjustment possible for the distortion profile. The target is to identify the distortion profile which cancels the nonlinearity of the digital-to-frequency conversion, while the PLL 400 is chirping in the background. When the nonlinearity is perfectly cancelled by the compensation table, the memorized low pass filter output remains flat around an AC or DC value as described above. In an embodiment, large steps are used at the beginning of the calibration to get quickly to a close result of the distortion profile. Afterwards, the step size is decrease for fine-tuning.

Although aspects of the present disclosure have been described with respect to specific embodiments, it will be readily appreciated that these aspects may be implemented in other forms within the scope of the disclosure as defined by the claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method of calibrating a two-point modulation phase locked loop (PLL) the PLL comprising a reference path, a phase/frequency detector, a loop filter, a controlled oscillator, a feedback path, a first injection point within at least one of the feedback path and the reference path and a second injection point between the loop filter and the controlled oscillator, the method comprising the steps of:
    injecting, at the first injection point, a first periodic control signal in the PLL;
    supplying, along the reference path, a reference signal to a first input of the phase/frequency detector;
    supplying, along the feedback path, a feedback signal to a second input of the phase/frequency detector, wherein the feedback signal is derived from at least a periodic frequency-modulated signal output from the PLL, wherein at least one of the reference signal and the feedback signal is at least partly derived from the first periodic control signal;
    generating, by a phase/frequency detector, an error signal representative of a phase or frequency error of the feedback signal with respect to the reference signal;
    filtering, by the loop filter, the phase/frequency error signal to generate a loop control signal;
    injecting, at the second injection point, a second periodic control signal in the PLL, wherein the second periodic control signal is derived from a first periodic input signal;
    regenerating, by the controlled oscillator, a periodic frequency-modulated signal based on the loop control signal and the second periodic control signal; and
    regenerating, within at least one of the feedback path and the reference path, at least one of the reference signal and the feedback signal from at least one of the reference signal, the periodic frequency-modulated signal and the first periodic control signal,
    wherein the method further comprises the steps of:
    observing, between the loop filter and the second injection point, the loop control signal over at least one period of the first periodic control signal;
    generating, from the observed loop control signal, a distortion profile; and
    applying the distortion profile to the second periodic control signal before injecting the second periodic control signal in the PLL.

2. The method of claim 1, wherein generating the distortion profile comprises scaling the observed loop control signal.

3. The method of claim 2, wherein generating the distortion profile comprises adding the observed loop control signal to a previous second periodic control signal.

4. The method of claim 2, wherein applying the distortion profile to the second periodic control signal before injecting the second periodic control signal in the PLL comprises adding the observed loop control signal to a previous second periodic control signal.

5. The method of claim 1, wherein observing the loop control signal over at least one period of the first periodic control signal comprises observing the loop control signal over a plurality of periods of the first periodic control signal and wherein step j) comprises averaging the observed loop control signal over the plurality of periods.

6. The method of claim 1, wherein observing the loop control signal over at least one period of the first periodic control signal comprises observing the control signal over a single period of the first periodic control signal.

7. The method of claim 6 wherein observing the loop control signal over at least one period of the first periodic control signal, generating the distortion profile, applying the distortion profile to the second periodic control signal before injecting the second periodic control signal in the PLL are executed once each period of the first periodic control signal.

8. The method of claim 1, wherein the steps of: observing the loop control signal over at least one period of the first periodic control signal, generating the distortion profile, and applying the distortion profile to the second periodic control signal before injecting the second periodic control signal in the PLL are performed iteratively.

9. The method of claim 1, wherein applying the distortion profile to the second periodic control signal before injecting the second periodic control signal in the PLL comprises storing a distorted second periodic control signal.

10. The method of claim 9, wherein applying the distortion profile to the second periodic control signal before injecting the second periodic control signal in the PLL comprises applying the distortion profile to the stored distorted second periodic control signal.

11. The method of claim 1, wherein the method further comprises, after a predefined number of periods, replacing the first periodic control signal with an updated periodic control signal having a shorter period.

12. The method of claim 1, wherein applying the distortion profile to the second periodic control signal before injecting the second periodic control signal in the PLL comprises adding the distortion profile to the original second periodic control signal over time.

13. The method of claim 1, wherein generating the distortion profile comprises generating the distortion profile as a sequence of digital codes stored in a memory.

14. The method of claim 13, wherein generating the distortion profile comprises mapping the sequence of digital codes to the period of the second periodic control signal.

15. The method of claim 1, wherein generating the distortion profile comprises generating the distortion profile with a step size, wherein the method further comprises the step of decreasing the step size for subsequently generating the distortion profile.

16. A calibration circuit for a two-point modulation phase locked loop (PLL) for generating a periodic frequency-modulated signal, wherein the PLL comprises:
 a reference path configured for supplying a reference signal to the PLL;
 a phase/frequency detector configured to generate a phase/frequency error signal representative of a phase or frequency error of a feedback signal with respect to the reference signal, wherein the feedback signal is derived from at least the periodic frequency-modulated signal output from the PLL;
 a loop filter coupled to the phase/frequency detector and configured to filter the phase/frequency error signal to generate a control signal;
 a controlled oscillator configured to generate the periodic frequency-modulated signal based on the control signal and a second periodic control signal;
 a feedback path from the controlled oscillator to the phase/frequency detector;
 a first injection point within at least one of the feedback path and the reference path and configured to inject a first periodic input signal in the PLL, wherein at least one of the reference signal and the feedback signal is at least partly derived from a first periodic control signal; and
 a second injection point between the loop filter and the controlled oscillator configured to inject the second periodic control signal in the PLL, wherein the second periodic control signal is derived from the first periodic input signal;
 wherein the calibration circuit comprises:
  an observation module configured to observe an output of the loop filter over at least one period; and
  a processor configured to generate a distortion profile from the observed control signal and to apply the distortion profile to the second periodic control signal before injecting the second periodic control signal in the PLL at the second injection point.

17. A two-point modulation phase locked loop, PLL, for generating a periodic frequency-modulated signal, the PLL comprising:
 a reference path configured for supplying a reference signal to the PLL;
 a phase/frequency detector configured to generate a phase/frequency error signal representative of a phase or frequency error of a feedback signal with respect to the reference signal, wherein the feedback signal is derived from at least the periodic frequency-modulated signal output from the PLL;
 a loop filter coupled to the phase/frequency detector and configured to filter the phase/frequency error signal to generate a control signal;
 a controlled oscillator configured to generate the periodic frequency-modulated signal based on the control signal and a second periodic control signal;
 a feedback path from the controlled oscillator to the phase/frequency detector;
 a first injection point within at least one of the feedback path and the reference path and configured to inject a first periodic input signal in the PLL, wherein at least one of the reference signal and the feedback signal is at least partly derived from a first periodic control signal; and
 a second injection point between the loop filter and the controlled oscillator and configured to inject the second periodic control signal in the PLL, wherein the second periodic control signal is derived from the first periodic input signal.

18. The two-point modulation phase locked loop of claim 17, wherein the PLL further comprises a calibration circuit.

19. The two-point modulation phase locked loop of claim 17 wherein an observation module is connected to the PLL between the filter and the second injection point.

* * * * *